United States Patent
Lesartre et al.

(10) Patent No.: US 10,460,800 B2
(45) Date of Patent: Oct. 29, 2019

(54) DATA SENSING IN CROSSPOINT MEMORY STRUCTURES

(71) Applicant: HEWLETT PACKARD ENTERPRISE DEVELOPMENT LP, Houston, TX (US)

(72) Inventors: Gregg B Lesartre, Fort Collins, CO (US); Martin Foltin, Fort Collins, CO (US); Yoocharn Jeon, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/748,667

(22) PCT Filed: Jul. 31, 2015

(86) PCT No.: PCT/US2015/043107
§ 371 (c)(1),
(2) Date: Jan. 30, 2018

(87) PCT Pub. No.: WO2017/023245
PCT Pub. Date: Feb. 9, 2017

(65) Prior Publication Data
US 2018/0358093 A1    Dec. 13, 2018

(51) Int. Cl.
| G11C 11/00 | (2006.01) |
| G11C 13/00 | (2006.01) |
| G11C 7/06 | (2006.01) |
| G11C 7/10 | (2006.01) |
| G11C 11/4074 | (2006.01) |

(52) U.S. Cl.
CPC ............ *G11C 13/0069* (2013.01); *G11C 7/06* (2013.01); *G11C 7/067* (2013.01); *G11C 7/106* (2013.01); *G11C 11/4074* (2013.01); *G11C 13/004* (2013.01); *G11C 13/0064* (2013.01); *G11C 2013/0073* (2013.01);
(Continued)

(58) Field of Classification Search
CPC ....... G11C 13/0069; G11C 7/06; G11C 7/067; G11C 7/106; G11C 11/4074; G11C 13/004; G11C 13/0064
See application file for complete search history.

(56) References Cited

U.S. PATENT DOCUMENTS

| 6,191,976 B1 | 2/2001 | Smayling et al. |
| 6,529,398 B1 | 3/2003 | Nair et al. |

(Continued)

OTHER PUBLICATIONS

Meenatchi Jagasivamani et al., "A Bipolar-Selected Phase Change Memory Featuring Multi-Level Cell Storage", IEEE Journal of Solid-State Circuits, Feb. 2009, See pp. 1-12.
(Continued)

*Primary Examiner* — Pho M Luu
(74) *Attorney, Agent, or Firm* — Hewlett Packard Enterprise Patent Department (57) ABSTRACT

A data storage device includes a memory cell array and sense circuitry to detect a data value stored to a memory cell of the memory cell array. The data storage device also includes a controller to bias the sense circuitry during a read phase of a write operation to increase the probability that the sense circuitry will detect an opposite value that is opposite from the value being written to the memory cell.

13 Claims, 5 Drawing Sheets

(52) U.S. Cl.
CPC .... *G11C 2207/063* (2013.01); *G11C 2213/71* (2013.01); *G11C 2213/77* (2013.01)

(56) References Cited

U.S. PATENT DOCUMENTS

| | | | |
|---|---|---|---|
| 6,674,679 | B1 | 1/2004 | Perner et al. |
| 7,633,809 | B2 * | 12/2009 | Kajiyama ............... G11C 7/065 365/185.24 |
| 7,916,515 | B2 | 3/2011 | Li et al. |
| 8,098,520 | B2 * | 1/2012 | Seigler ................... G11C 11/16 365/173 |
| 8,315,089 | B2 | 11/2012 | Kang et al. |
| 8,830,733 | B2 * | 9/2014 | El Baraji ............ G11C 11/1673 365/158 |
| 9,299,746 | B2 * | 3/2016 | Ribeiro .............. G11C 13/0004 |
| 2007/0236987 | A1 | 10/2007 | Cho et al. |
| 2009/0040816 | A1 | 2/2009 | Kang et al. |
| 2011/0235399 | A1 | 9/2011 | Sasaki |
| 2012/0230122 | A1 | 9/2012 | Chandra et al. |
| 2014/0112054 | A1 | 4/2014 | Shimakawa et al. |

OTHER PUBLICATIONS

PCT/ISA/KR, International Search Report and Written Opinion, dated Jun. 3, 2016, PCT/US2015/043107, 12 pages.
Rawan Naous, "Memristor based crossbar memory array sneak path estimation," Cellular Nanoscale Networks and their Applications, Jul. 29-31, 2014, IEEE.

* cited by examiner

500
FIG. 5

DATA SENSING IN CROSSPOINT MEMORY STRUCTURES

BACKGROUND

A crosspoint memory array is an array of memory cells disposed between two sets of conductors running orthogonally on opposite sides of the memory cells. The first set of conductors, disposed on one side of the memory cells, may be referred to as the word lines, while the second set of conductors, disposed on the other side of the memory cells, may be referred to as bit lines. A multi-layer crosspoint memory array can include several layers of memory cells alternating between layers of word lines and bit lines. A three-dimension crosspoint memory array can include several layers of memory cells, with word lines running horizontally between the layers and bit lines running vertically through the layers. Each memory cell in the crosspoint memory array is disposed at the crosspoint of a single word line and a single bit line. Selection of a single memory cell within the array for reading or writing the memory cell can be achieved by activating the word line and bit line associated with that memory cell. Writing data to the memory cell may involve applying a voltage pulse to a selected memory cell to change the memory cell's resistance state. The reading of the selected memory cell may be achieved by applying a read voltage to a selected memory cell and measuring the resulting current through the selected memory cell.

BRIEF DESCRIPTION OF THE DRAWINGS

Certain embodiments are described in the following detailed description and in reference to the drawings, in which.

DETAILED DESCRIPTION

In a crosspoint memory array, data may be written to a memory cell, such as a memristor, by applying a voltage or current pulse to the memory cell that changes the resistance state of the memory cell. For example, a set pulse may be used to obtain a low resistance state representing a logical one, and a reset pulse may be used to obtain a high resistance state representing a logical zero. Reading the memory cell involves applying a voltage across the memory cell and measuring the current to determine cell's resistance state. These new memory technologies can provide to high speed, high capacity system memory and data storage.

However a crosspoint array memory structure can pose challenges for reading and writing data. For example, the voltage seen at an individual cell of a crosspoint memory array during set or reset operations varies depending on the location of the cell in the array and the data stored its the array's other cells. This variation may be due in part to leakage currents known as sneak currents that may exist in neighboring cells or cells that share a same interconnect as the selected cell. Furthermore, each time a memory cell receives a set or reset pulse, the memory cell will tend to degrade, particularly if the set and reset voltages are too high. Therefore, writes are carefully controlled to avoid excessive wear on the memristor elements. Furthermore, device variations, sneak currents, and other operating fluctuations can cause variations in the apparent response of a memory cell when that memory cell is being read. Therefore, writes are also controlled to ensure that the stored data can later be read properly even if conditions surrounding the memory cell vary.

One technique to ensure write robustness while also reducing wear is to use a read-write-verify process to execute writes to the crosspoint array. In a system that uses read-write-verify, each write of a memory cell involves a preliminary read phase, a write phase, and a verity phase. During the preliminary read phase, the current state of the memory cell is read and the sensed value is used to determine whether a write is needed to change the value of the memory cell. During the write phase, if the resistance state is to be changed, the memory cell may be pulsed to store the data. During the verify phase, the data can be read again to determine whether the pulse was successful at creating the desired resistance state. If the verify phase indicates that the desired data has not been successfully updated to the memory cell, additional write and verify cycles can be performed until the desired data is in the memory cell. This read-write-verify process reduces the amount of wear and disruption to the memory cell while still ensuring that the data is reliably stored.

The present disclosure describes a memory device that reads memory cells differently depending on whether the read is for a read operation or a phase of a write operation. For a read operation, the sense logic is able to detect the correct data across a wide range of environment and device variation, whether the data is a one or a zero. For write verifies however, the data to be sensed is known, and the purpose of the write verify is to decide whether the data has been robustly written to the target memory device. Accordingly, when performing a write verify, the memory device's detection circuitry is configured to favor detecting the opposite value from the bit value to be written. In this way, the memory device will not indicate that the write is complete when the correct data has been barely written and better results could be achieved by instead allowing another write/verify cycle to ensure that the data is robustly written.

As used herein, a "read operation" refers to the process of acquiring data from the memory array to be sent to a software application that requested it, and a "write operation" refers to the process of storing data to the memory array. As described above, data may be read from a memory cell during both read operations and write operations. The term 'verify phase' refers to the phase of the write operation during which the value of the memory cell is read for the purpose of determining whether the value has been correctly written to the memory cell. For purposes of the present description, both the preliminary read phase of a write operation and the verify phase of a write operation may be referred to herein as "read phases" of a write operation.

Figure 1:
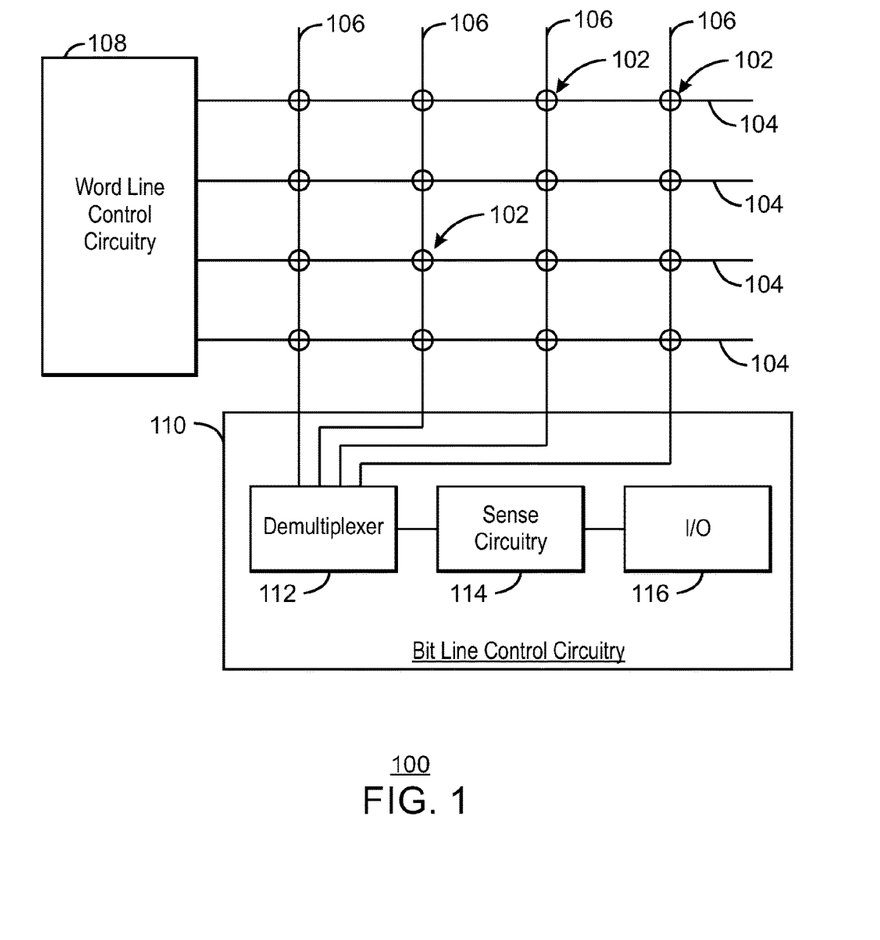
FIG. 1 is a block diagram of an example of a data storage device.

FIG. 1 is a block diagram of a data storage device. As shown in FIG. 1, the data storage device 100 may include an array of memory cells 102 arranged in rows and columns. A set of conductive electrodes, referred to herein as word lines 104, extend over one side of the array of memory cells 102. Each word line 104 makes electrical contact with the memory cells 102 of a particular row. A set of conductive electrodes, referred to herein as bit lines 106, extend over the other side of the array of memory cells 102. Each bit line 106 makes electrical contact with the memory cells 102 of a particular column. In some examples, the array of memory cells 102 may be a multi-layer array. In a multi-layer array, several arrays of memory cells 102 can be stacked on top of one another with a set of bit lines or a sot of word lines disposed between each layer of memory cells. In a three-dimensional crosspoint memory array, the memory cell arrays are stacked with word lines running horizontally between the layers and bit lines running vertically through the layers. A multi-layer or three-dimensional memory cell array can include any suitable number of memory cell layers. In single-layer, multi-layer, and three-dimensional arrays, each memory cell 102 lies at the crosspoint of one word line 104 and one bit line 106. Each memory cell 102 may be selected for writing or reading by activating the particular word line 104 and bit line 106 associated with that memory cell 102. As discussed further below in reference to FIG. 2, each memory cell 102 may include a resistive memory element coupled in series with a selector device such as a diode, a transistor, a diode for alternating current (DIAC), or a Metal-Insulator-Metal (MIM) structure, including a simple MIM capacitor, an Ovonic threshold switch, a VO2/NbO2 threshold switch, etc.

The data storage device also includes word line control circuitry 108 coupled to the memory cells 102 through the respective word lines 104 and configured to activate a particular word line 104 for the reading or writing of a particular memory cell 102 associated with the word line 104. For example, the word line control circuitry 108 may include a demultiplexer for selecting a particular one of the word lines 104 to receive read or write activation voltage. The data storage device also includes bit line control circuitry 110 coupled to the memory cells 102 through the respective bit lines 106. The bit line control circuitry 110 may include a multiplexer 112, sense circuitry 114, and an Input/Output (I/O) pad 116. The multiplexer 112 may be configured to selectively couple the bit line 106 of the selected memory cell 102 to the sense circuitry 114. The word line control circuitry 108 and the bit line control circuitry 110 act in concert to access individual memory cells 102 by activating the corresponding word line 104 and bit line 106 coupled to the selected memory cell 102. It will be appreciated that the word line control circuitry 108 and the bit line control circuitry 110 described herein are examples of circuitry that may be used in an exemplary embodiment for accessing the memory cells 102. Other configurations known to those skilled in the art may be used for accessing the memory cells 102 in accordance with the present techniques. For example, rather than multiplexing the bit lines to the sense circuitry, as shown in FIG. 1, each bit line 106 can have its own separate sense circuitry.

During a write operation, the word line control circuitry 108 writes information to the selected memory cell 102 by applying a voltage to the specific word line 104 corresponding to the selected memory cell 102. The multiplexer 112 of the bit line control circuitry 110 activates the selected memory cell 102 by coupling the memory cell 102 to around. Current then flows through the selected memory cell 102, which affects the properties of the memory cell 102, in effect storing a logical one or logical zero to the memory cell 102. For example, if the memory element included in the memory cell 102 is a memristor, the current flowing through the memristor changes the memristor's resistance. The change in the resistance can be detected during a subsequent read operation.

To read a memory cell, the word line control circuitry 108 activates the selected memory cell 102 by applying a specified voltage to the corresponding word line 104, and the multiplexer 112 couples the bit line 106 corresponding to the selected memory cell 102 to the sense circuitry 114. The resulting current detected by the sense circuitry 114 indicates the state of the memory cell 102, for example, whether the memory cell 102 corresponds to a logical one or logical zero. If the read is part of a read operation, the result of the read is then sent to the I/O pad 116 of the memory device. The sense circuitry can also be used for the read phase of a write operation and the verify phase of a write operation.

The sense circuitry can be configured to read data differently depending on whether the read is part of a read operation or a read phase of a write operation. For example, a different read reference can be used to drive the read bias of a memory array sense circuit, depending on whether a read operation or a read phase of a write operation is being performed, if a write verify is being performed, a different sense bias can be used for verifying a write to a one compared to a write to a zero. In the case of a write verify, the reference is initially selected to favor detecting the opposite value from the bit value to be written. If a value of one is to be written, the sense bias will be skewed to favor sensing a zero. If a value of zero is to be written, the sense bias will be skewed to favor a one. In this way the read-write-verify sequencing will continue until the value is set robustly, improving the likelihood that the correct value will be read at a later time when the data is referenced with a read. The same sense bias used for the write verify can also be used for the preliminary read phase of the write operation.

Other variables may also be taken into account during the read phase of write operations to ensure the data can be correctly read during subsequent read operations even when the environment, device variation, and surrounding data influences on the data change between the time of the write and a subsequent data access. One such variable is the amount of sneak current that may flow through surrounding memory devices in a memory cross-point array when a given device is read. The amount of current that flows is dependent in part on the data stored in the surrounding devices. To improve the reliability of a subsequent read operation, the verify can be biased with increased or reduced sneak current to ensure a subsequent correct read in the case that the sneak current at the time of that read operation has changed since the time of the data write. This may for instance be achieved by biasing the sneak current subtraction component during the verify phase. The sneak current circuitry will first measure the background sneak current through an array before attempting to read the data on a memory device so that the sneak current may be factored out before determining the data value read.

Figure 2:
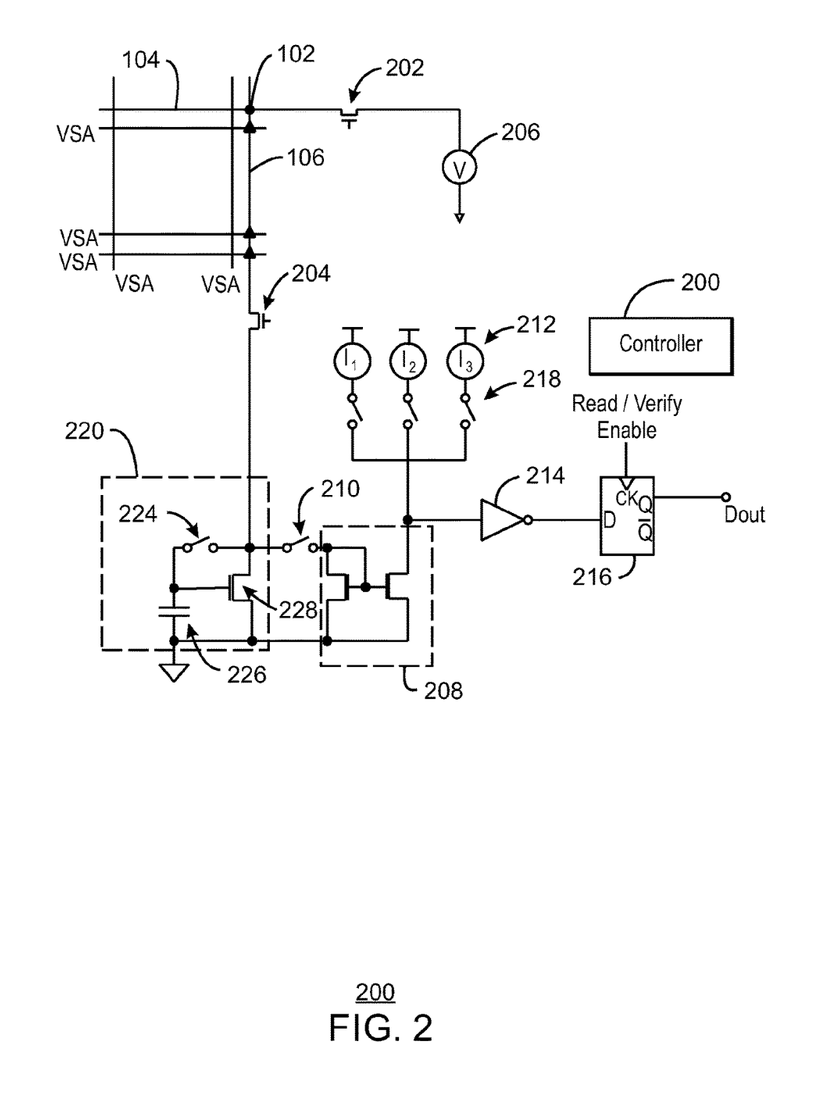
FIG. 2 is a circuit diagram of an example of sense circuitry that can be used in a crosspoint memory array.
Figure 3:
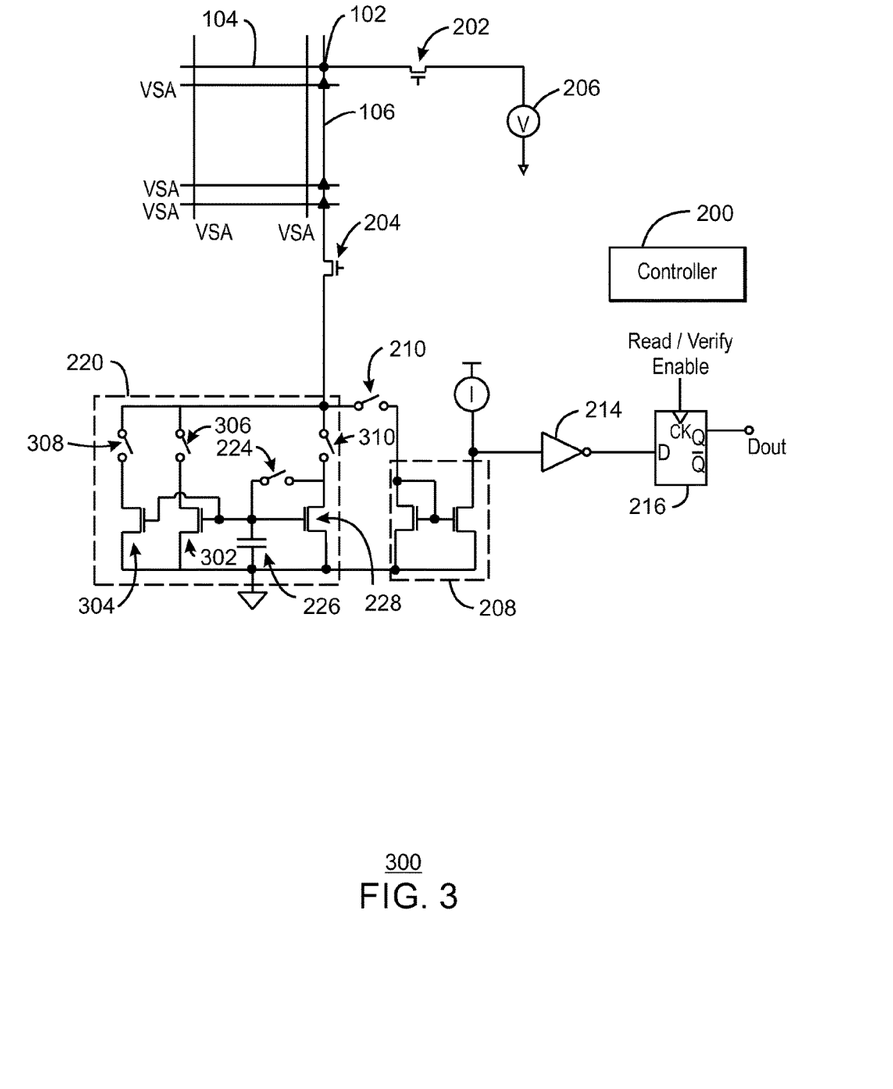
FIG. 3 is a circuit diagram of another example of sense circuitry that can be used in a crosspoint memory array.
Figure 4:
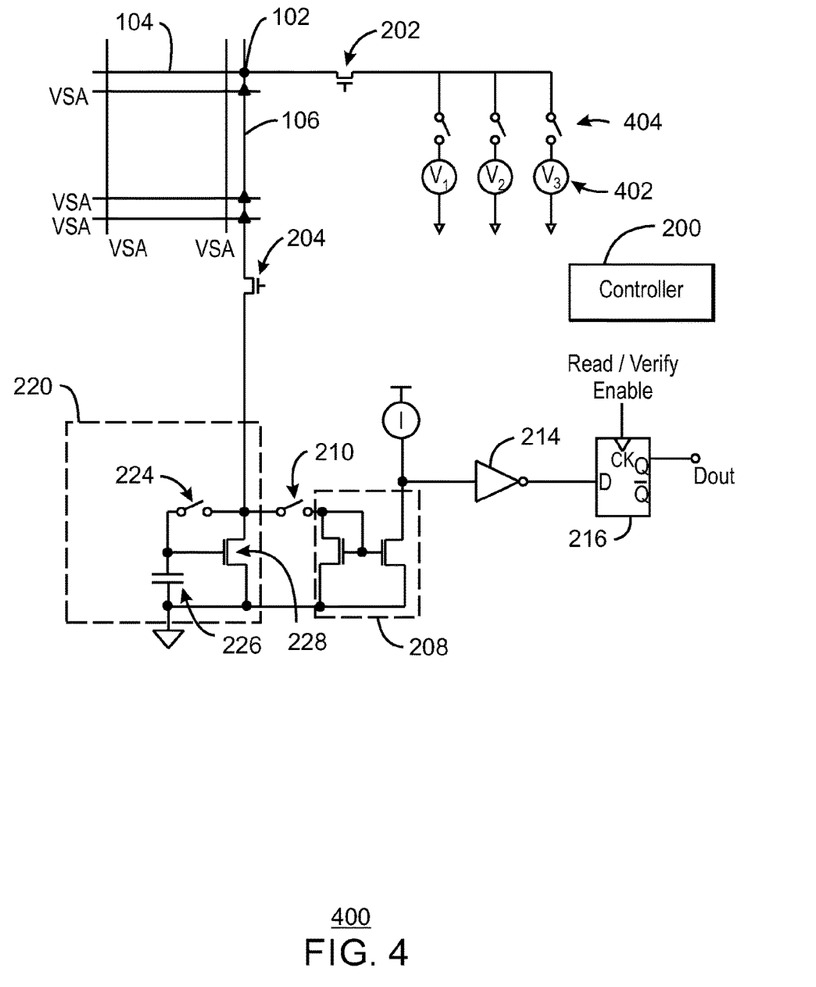
FIG. 4 is a circuit diagram of another example of sense circuitry that can be used in a crosspoint memory array.

The read phase of write operations may also be disadvantaged by performing the verify with a drooped or over spec voltage supply for the read, to ensure that the data can be read when the subsequent read operation is performed in a system with a higher or lower, but still within spec voltage supply. In some examples, the verify phase may be performed at multiple biases of voltages, sneak current or other parameter to ensure that the data has been robustly written before considering the write complete. FIGS. 2-4 show examples of sense circuitry that can be used to implement the read techniques described herein.

FIG. 2 is a circuit diagram of an example of sense circuitry that can be used in a crosspoint memory array. FIG. 2 shows a single memory cell 102 of the crosspoint memory array 100 shown in FIG. 1. The memory cell 102 has been selected by the word line control circuitry 108 and the bit line control circuitry 110. Specifically, the selected wore line 104 is coupled to a voltage source 206 through a switch 202, which is part of the word line control circuitry 108, and the selected bit line 106 is coupled to the sense circuitry 114 through a switch 204, which is part of the multiplexer 112 of the bit line control circuitry 110.

To sample the current through the selected cell, switch 210 is closed and the voltage across the selected memory cell 102 causes a current to flow to ground through a current mirror 208. The current through the current mirror 208 is compared with one of the reference currents 212, shown in FIG. 2 with the labels $I_1$, $I_2$, and $I_3$. The input of the buffer 214 will be the difference between the selected reference current and the current through the current mirror 208. The output of the amplifier 214 is sent to a latch 216 that outputs either a one or a zero at $D_{out}$. If the current through the current mirror 208 is greater than the reference current, the latch 216 outputs a logic one. If the current through the current mirror 208 is less than the reference current, the latch 216 outputs a logic zero.

Each of the current references are associated with a corresponding switch 218 that is selectable to engage the selected current reference by coupling the selected current reference to the input of the buffer 214. The switches 218 may be any suitable type of switches, including transistors, Microelectromechanical systems (MEMS), and others. The switches 218 may be coupled to a controller 200 that coordinates the reading the memory cell 102 and can selectively engage one of the current references during the reading of the memory cell 102.

The particular current reference engaged depends on the type of operation being performed. The current reference engaged for read operations is neutral, meaning that is used to increase the probability of detecting the correct data without favoring the detection of a one or a zero. In the example of FIG. 2, the neutral current reference engaged for read operations is referred to as I2. For the preliminary read or verify phase of write operations, the current reference I1 or I3 is engaged, depending on whether a zero or one is being written. As compared to read operations, the selected current reference is to decrease the probability that the correct data is read. For example, if a zero being written, the selected current reference increases the probability of detecting a one, and if a one is being written, the selected current reference increases the probability of detecting a zero. If logical zero is represented as a higher resistance state, then lower current will be detected when reading a zero. Thus, when writing a zero, the current reference used in the verify phase is lower compared to the neutral current reference, I2, which increases the probability that a logical one will be detected. When writing a one, the current reference used in the verify phase is higher compared to the neutral current reference, I2, which increases the probability that a logical zero will be detected.

The degree to which the current references I1 and I3 vary from the neutral current reference, I2, will depend on design considerations for a particular implementation. In some examples, I1 and I3 vary from the neutral current reference by 5 to 10 percent. It will be appreciated that various other circuits can be used to change the reference current, and that the present circuit is provided merely as an example.

In some examples, the sense circuitry includes a sneak current compensation circuit 220. The sneak current compensation circuit 220 operates by sampling the sneak currents that exist in the crosspoint memory array 100 near the selected memory cell 102. While sampling the sneak current, switches 210 is open and switch 224 is closed. The sampled sneak current charges the capacitor 226. During the holding of the memory cell current, switch 210 is closed and switch 224 is open. This configuration causes current to flow through the transistor 228, which is activated by the charge stored to the capacitor 226. The current generated as the capacitor 226 discharges is referred to as the applied sneak current. In the example of FIG. 2, the applied sneak current is equal to the sampled sneak current. The applied sneak current reduces the current through the current mirror 208 and reduces the perceived current sensed during the sampling of the memory cell 102. The sneak current is sampled before the selected sword line is driven with the word line read voltage delivered through transistor 202.

In some examples, the sneak current applied during the sampling of the memory cell 102 can be increased or reduced during the preliminary read or verify phase of a write operation to improve the robustness of the write. An example of a circuit configured to adjust the sneak current is shown in FIG. 3.

FIG. 3 is a circuit diagram of another example of sense circuitry that can be used in a crosspoint memory array. The sense circuitry shown in FIG. 3 operates in a manner similar to the sense circuitry shown in FIG. 2, except that the sneak current compensation can be adjusted depending on the type of operation being performed. To improve the robustness of a data write, the applied sneak current can be increased or decreased during the verify phase of the write operation to account for the possible changes in sneak current and/or resistances of the memory cell that may be in effect during a subsequent read operation.

The sneak current compensation circuit 220 includes a set of three transistors 228, 302, and 304, each of which are associated with a corresponding switch 306, 308, or 310 that is selectable to engage the selected transistor. The switches 306, 308, and 310 may be any suitable type of switches and may be coupled to the controller 200, which coordinates the reading the memory cell 102.

During the sampling of the sneak current the switches 224 and are closed and the switches 306 and 308 are open. Therefore, the transistor 228 is turned on and the other transistors 302 and 304 are turned off. During the sampling of the sneak current, the switch 210 is also open, and the capacitor 226 charges as described above. To apply the sneak current, the switch 224 is opened, switch 210 is closed, and one of the switches 306, 308 or 310 is engaged depending on whether the sneak current is to be adjusted.

For read operations, the sneak current applied during the read is equal to the sampled sneak current. This increases the probability of detecting the correct data without favoring the detection of a one or a zero. To apply the sampled, sneak current without any sneak current adjustment, the switch 310 remains closed so that the same transistor 228 is used in sampling the sneak current and to applying the sneak current. In this way, the applied sneak current is the same as the sampled sneak current and the sneak current compensation circuit operates as described in FIG. 2.

For the preliminary read or verify phase of write operations, the transistor 302 or 304 may be engaged during the application of the sneak current, depending on whether a zero or one is being written. The selection of the transistor 302 or 304 increases or decreases the applied sneak current compared to the sampled sneak current. The applied sneak current can be controlled by scaling the electrical characteristics of the selected transistor 302 or 304 compared to transistor 228. The degree to which the applied sneak current varies from the sampled sneak current will depend on design considerations for a particular implementation. In some examples, the currents through transistors 302 and 304 may vary from the current through transistor 228 by 5 to 10 percent.

As compared to read operations, the selected transistor is to decrease the probability that the correct data is read. Increasing the applied sneak current decreases the apparent sensed current and increases the probability of detecting a zero. Therefore, if a one is being written, the applied sneak current is increased to increase the probability of detecting a zero. Conversely, decreasing the applied sneak current, increases the apparent sensed current and increases the probability of detecting a one. Therefore, if a zero is being written, the applied sneak current is decreased to increase the probability of detecting a one. It will be appreciated that various other circuits can be used to change the applied sneak current, and that the present circuit is provided merely as an example.

FIG. 4 is a circuit diagram of another example of sense circuitry that can be used in a crosspoint memory array. The sense circuitry shown in FIG. 3 operates in a manner similar to the sense circuitry shown in FIG. 2, except that the voltage source used to drive current through the memory cell can be adjusted depending on the type of operation being performed. To improve the robustness of a data write, the applied voltage source can be increased or decreased during the verify phase of the write operation to account for changes in the voltage source that could occur during a subsequent read operation.

Each of the voltage sources 402 are associated with a corresponding switch 404 that is selectable to engage the selected voltage source 402 by coupling the selected voltage source 402 to the selected word line 104. The switches 404 may be any suitable type of switches and may be coupled to a controller (not shown) that coordinates the reading the memory cell 102.

The particular voltage source 402 engaged depends on the type of operation being performed. The voltage source 402 engaged for read operations is neutral, meaning that is used to increase the probability of detecting the correct data without favoring the detection of a one or a zero. In the example of FIG. 4, the neutral voltage source 402 engaged for read operations is referred to as V2. For the verify phase of write operations, the voltage source V1 or V3 is engaged, depending on whether a zero or one is being written. As compared to read operations, the selected voltage source is to decrease the probability that the correct data is read. For example, if a zero is being written, the selected voltage source increases the probability of detecting a one, and if a one is being written, the selected voltage source 402 increases the probability of detecting a zero. If logical zero is represented as a higher resistance state, then lower current will be detected when reading a zero. Thus, when writing a zero, the selected voltage source used in the verify phase provides a higher voltage level compared to the neutral voltage source, V2, which increases the probability that a logical one will be detected. When writing a one, the voltage source used in the verify phase provides a lower voltage compared to the neutral voltage source 402, V2, which increases the probability that a logical zero will be detected.

The degree to which the voltage source V1 and V3 vary from the neutral voltage source 402, V2, will depend on design considerations for a particular implementation. In some examples, V1 and V2 vary horn the neutral current reference by 5 to 10 percent. It will be appreciated that various other circuits can be used to change the reference current, and that the present circuit is provided merely as an example.

In some examples, some or ail of the features described in reference to FIGS. 2-4 may be combined in one circuit. For example, the sense circuitry have the ability to adjust the voltage source, the current reference, and the sneak current, or any combination of thereof. In some examples, the sense circuitry may take several current samples during the write verify phase, adjusting one or more of the voltage source, the current reference, and the sneak current for each sample.

Figure 5:
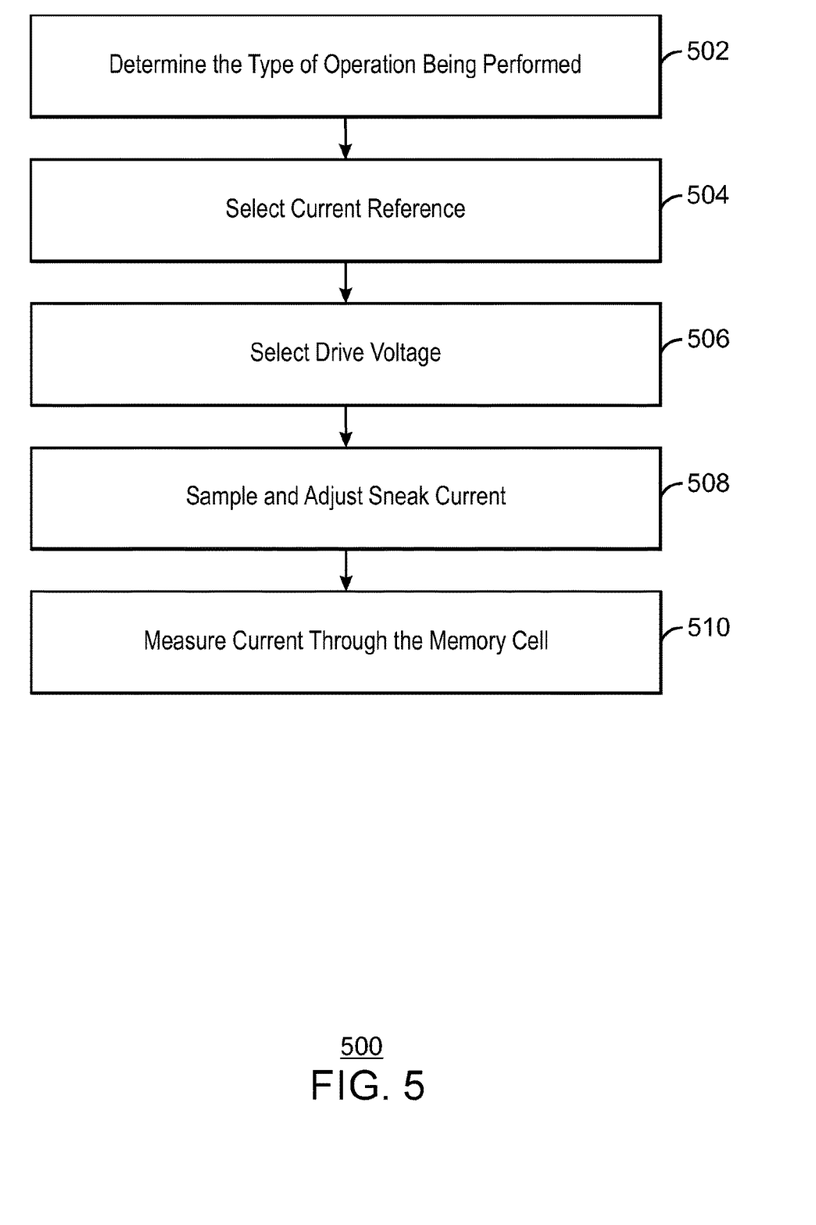
FIG. 5 is a process flow diagram of a method of reading a memory cell its a crosspoint memory array.

FIG. 5 is a process flow diagram of a method of reading a memory cell. The method may be referred to by the reference number 500, and is performed by a data storage device, such as the data storage device 100 shown in FIG. 1.

At block 502, a determination is made regarding the type of operation being performed, for example, whether the operation is being performed is a read operation or a write operation. If the operation is a write operation, it may further be determined whether a zero or a one if being written to the cell. The determinations made at block 502 determine the parameters the sensing circuitry uses to read the data from the memory cell.

At block 504, a current reference is selected based in part on whether a write operation or a read operation is being performed. It a write operation is being performed, the selection of the current reference will also depend on whether a zero or a one is being written. For a verify phase of a write operation, the selected current reference increases the probability of detecting a value opposite from the value being written to the memory cell. This helps to ensure that the data is written more robustly.

At block 506, a drive voltage is selected based on the type of operation being performed. The drive voltage is the voltage used to drive current through the memory cell. For a verify phase of a write operation, the selected drive voltage increases the probability that the sense circuitry will detect an opposite value that is opposite from the value being written to the memory cell.

At block 508, a sneak current is sampled. The sneak current is to be subtracted from the current measured through the memory cell. For a verify phase of a write operation, the sampled sneak current is adjusted before being subtracted from the current measured through the memory cell. The sneak current adjustment voltage increases the probability that the sense circuitry will detect an opposite value that is opposite from the value being written to the memory cell.

At block 510, the current through the memory cell is measured and compared to the selected reference current to determine a resistance state of the memory cell. The resistance state indicates whether a zero or a one is stored to the memory cell.

In some embodiments, blocks 504, 506 508, and 510 are repeated one or more additional times using different selections for the current reference, the drive voltage, and the sneak current adjustment.

It is to be understood that the process flow diagram of FIG. 5 is not intended to indicate that the method is to include all of the blocks shown in FIG. 5 in every case. Further, any number of additional blocks can be included within the method, depending on the details of the specific implementation. In addition, it is to be understood that the process flow diagram of FIG. 5 is not intended to indicate that the method is only to proceed in the order indicated by the blocks shown in FIG. 5 in every case.

The examples described herein may be susceptible to various modifications and alternative forms and have been shown only for illustrative purposes. Furthermore, it is to be understood that the present techniques are not intended to be limited to the particular examples disclosed herein. Indeed, the scope of the appended claims is deemed to include all alternatives, modifications, and equivalents that are apparent to persons skilled in the art to which the disclosed subject matter pertains.

What is claimed is:

1. A data storage device, comprising
a memory cell array; and
sense circuitry to detect a data value stored to a memory cell of the memory cell array;
the controller to bias the sense circuitry during a read phase of a write operation;
wherein:
the sense circuitry is to sample a sneak current and subtract the sneak current from the current measured through the memory cell; and
to bias the sense circuitry, the sneak current is further increased or decreased compared the sampled sneak current.

2. The data storage device of claim 1, wherein to bias the sense circuitry, a reference current is selected based in part on whether a zero or a one is being written to the memory cell.

3. The data storage device of claim 1, wherein to bias the sense circuitry the sense circuitry is to select a drive voltage to be applied to the memory cell, wherein the selected drive voltage is to increase the probability that the sense circuitry will detect an opposite value that is opposite from the value being written to the memory cell.

4. The data storage device of claim 1, wherein during the write verify phase of a write operation, a plurality measurements are made of the current through the memory cell for different values of a current reference, a drive voltage, and a sneak current.

5. A method of reading a memory cell, comprising:
determining whether a write operation or a read operation is being performed;
selecting a current reference based in part on whether a write operation or a read operation is being performed;
measuring a current through the memory cell and comparing the current to the selected reference current to determine a resistance state of the memory cell;
sampling a sneak current that is to be subtracted from the current measured through the memory cell; and
selecting a sneak current adjustment based in part on whether a write operation or a read operation is being performed;
wherein, if the reading is being performed for a verify phase of a write operation, the selected current reference increases the probability of detecting a value opposite from the value being written to the memory cell.

6. The method of claim 5, wherein the selected reference current is selected based in part on whether a zero or a one is being written to the memory cell.

7. The method of claim 5, comprising selecting a drive voltage to drive current through the memory cell to increase the probability that the sense circuitry will detect an opposite value that is opposite from the value being written to the memory cell.

8. The method of claim 5, comprising during a single write verify phase, performing a plurality of measurements of the current through the memory cell using different selections for the current reference, a drive voltage, and a sneak current.

9. A data storage device comprising circuitry to:
determine whether a write operation or a read operation is being performed;
select a current reference based in part on whether a write operation or a read operation is being performed; and
measure a current through the memory cell and comparing the current to the selected reference current to determine a resistance state of the memory cell;
wherein, if the reading is being performed for a verify phase of a write operation, the selected current reference increases the probability of detecting a value opposite from the value being written to the memory cell.

10. The data storage device of claim 9, wherein the selected reference current is selected based in part on whether a zero or a one is being written to the memory cell.

11. The data storage device of claim 9, comprising selecting a drive voltage to drive current through the memory cell that is different from the first drive voltage and increases the probability that the sense circuitry will detect an opposite value that is opposite from the value being written to the memory cell.

12. The data storage device of claim 9, comprising sampling a sneak current that is to be subtracted from the current measured through the memory cell, and selecting a sneak current adjustment based in part on whether a write operation or a read operation is being performed.

13. The data storage device of claim 9, comprising during a single write verify phase, performing several measurements of the current through the memory cell using different selections for the current reference, a drive voltage, and a sneak current.

* * * * *